(12) United States Patent
Buehler

(10) Patent No.: US 6,971,151 B2
(45) Date of Patent: Dec. 6, 2005

(54) METHODS OF TREATING PHYSICAL VAPOR DEPOSITION TARGETS

(75) Inventor: Jane Buehler, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 793 days.

(21) Appl. No.: 10/081,757

(22) Filed: Feb. 19, 2002

(65) Prior Publication Data

US 2002/0079217 A1 Jun. 27, 2002

Related U.S. Application Data

(62) Division of application No. 09/687,947, filed on Oct. 13, 2000, now Pat. No. 6,503,380.

(51) Int. Cl.[7] .............................................. B23P 25/00
(52) U.S. Cl. ......................... 29/458; 29/459; 29/527.1
(58) Field of Search ................... 29/458, 459, 527.1; 204/298.12, 298.13; 428/192, 457, 544; 72/74, 72/80

(56) References Cited

U.S. PATENT DOCUMENTS

| | | |
|---|---|---|
| 3,530,881 A | 9/1970 | Lester |
| 3,985,635 A | 10/1976 | Adam et al. |
| 4,551,216 A | 11/1985 | Argyo |
| 4,855,033 A | 8/1989 | Hurwitt |
| 5,269,894 A | 12/1993 | Kerschbaumer |
| 5,282,943 A | 2/1994 | Lannutti et al. |
| 5,336,386 A | 8/1994 | Marx et al. |
| 5,538,603 A | 7/1996 | Guo |
| 5,589,040 A | 12/1996 | Nishimura |
| 5,632,869 A | 5/1997 | Hurwitt et al. |
| 5,658,442 A | 8/1997 | Van Gogh et al. |
| 5,753,090 A | 5/1998 | Obinata |
| 5,755,887 A | 5/1998 | Sano et al. |
| 6,086,735 A | 7/2000 | Gilman et al. |
| 6,162,297 A | 12/2000 | Mintz et al. |

FOREIGN PATENT DOCUMENTS

| | | |
|---|---|---|
| JP | 06 306597 | 11/1994 |
| JP | 2001-316798 A | 11/2001 |
| WO | WO 98/31845 | 7/1998 |
| WO | 01/32018 | 11/2001 |

Primary Examiner—David P. Bryant
Assistant Examiner—Stephen Kenny
(74) Attorney, Agent, or Firm—Wells St. John P.S.

(57) ABSTRACT

The invention encompasses a method of treating a physical vapor deposition target. The target has a sputtering surface and a sidewall edge at a periphery of the sputtering surface. The method comprises pressing a tool against the sidewall edge to form a distribution of imprints in the sidewall edge of the target. The tool is then removed from the sidewall edge, leaving the imprints extending into the sidewall edge. The invention also encompasses a physical vapor deposition target. The target includes a sputtering surface having an outer periphery, and a sidewall edge along the outer periphery of the sputtering surface. The sidewall edge has a repeating pattern of imprints extending therein.

13 Claims, 4 Drawing Sheets

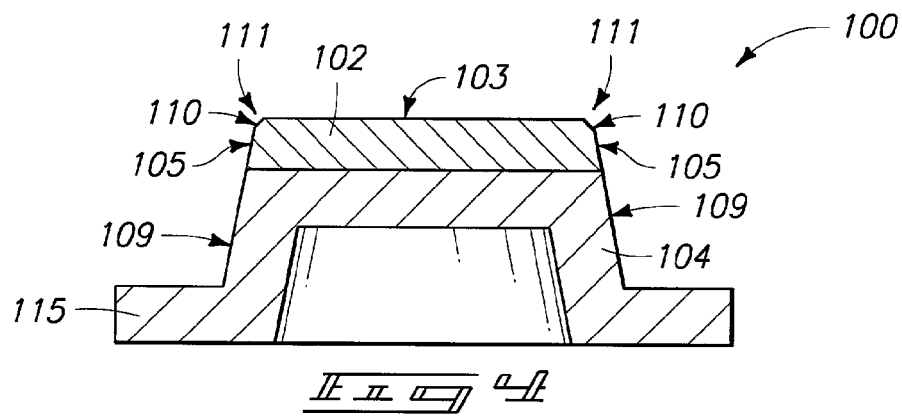
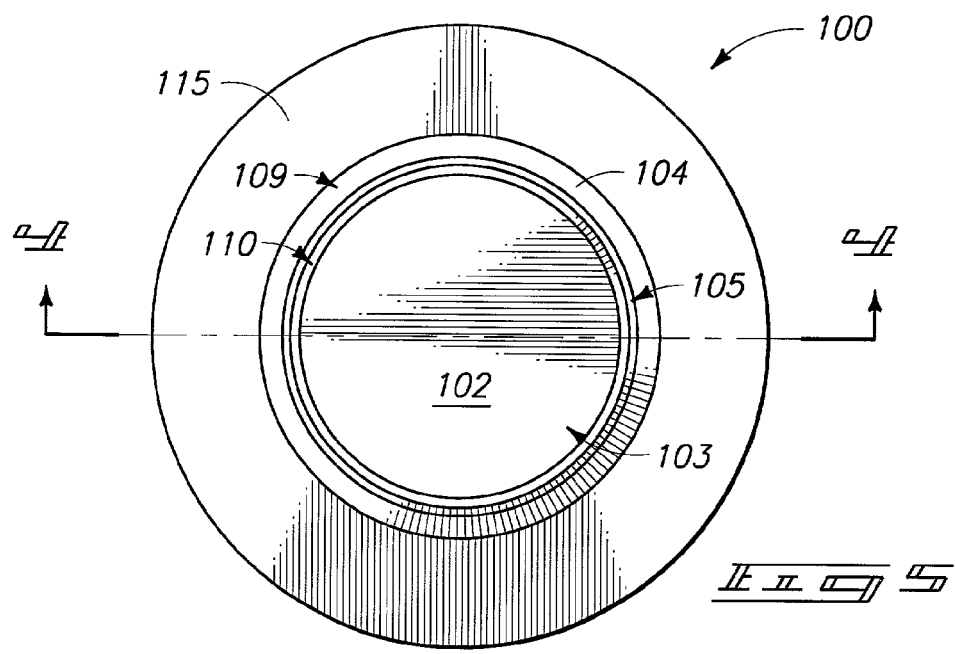
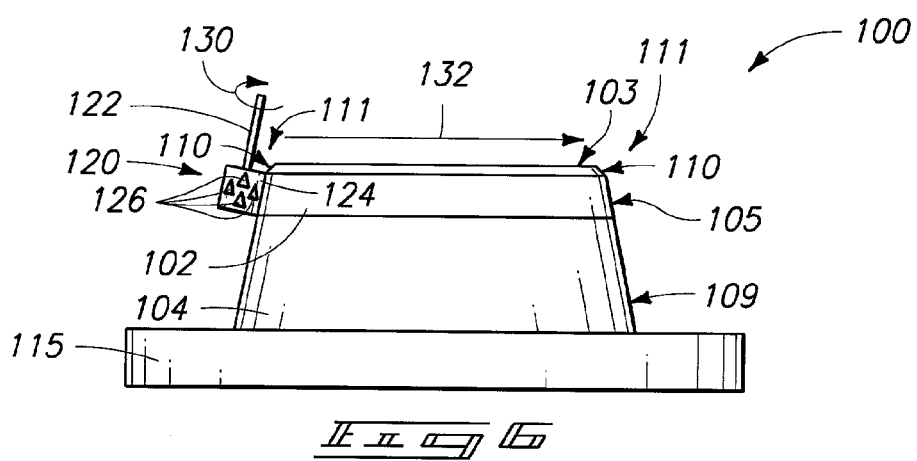

US 6,971,151 B2

METHODS OF TREATING PHYSICAL VAPOR DEPOSITION TARGETS

RELATED PATENT DATA

This patent resulted from a divisional application of U.S. patent application Ser. No. 09/687,947, which was filed on Oct. 13, 2000 now U.S. Pat. No. 6,503,380.

TECHNICAL FIELD

The invention pertains to physical vapor deposition target constructions and to methods of treating physical vapor deposition targets.

BACKGROUND OF THE INVENTION

Physical vapor deposition methods (which include, for example, sputtering methods) have wide application in fabrication processes when thin films are desired. For instance, sputtering processes are frequently utilized in semiconductor processing applications for forming thin films across a semiconductor substrate.

An exemplary sputtering process is described with reference to FIG. 1. Specifically, an apparatus 10 is shown comprising a physical vapor deposition target 12 above a semiconductor substrate 14. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Target 12 has a sputtering surface 15. In operation, ions or atoms (not shown) are impacted against a sputtering surface 15 and utilized to eject material from the sputtering surface toward substrate 14. The ejected material is illustrated by downwardly-directed arrows. The arrows are a standard way of showing ejected material relative to a physical vapor deposition target. An alternative description of the ejected material is to show the material as a cloud 16, since the ejected material generally has an appearance of a mist. The ejected material tends to migrate in three dimensions, rather than simply toward substrate 14, and accordingly, some of the ejected material returns to target 12.

The illustrated apparatus shows target 12 bonded to a backing plate 18. Further, target 12 is shown to comprise a sidewall surface 20 which joins to a periphery of sputtering surface 15. Also, backing plate 18 is shown to comprise a sidewall surface 22 which is coextensive with sidewall surface 20 of target 12. Cloud 16 overlaps surfaces 20 and 22, and accordingly some of the ejected material from sputtering surface 15 is redeposited on sidewall surfaces 20 and 22.

The redeposited material can be problematic in semiconductor device fabrication. In an exemplary process, target 12 comprises titanium, and is sputtered in a nitrogen-containing gas to sputter-deposit a layer of titanium nitride over substrate 14. FIG. 2 illustrates an expanded view of substrate 14 after deposition of titanium nitride over a surface of substrate 14. Specifically, FIG. 2 shows that target 14 has an opening 30 extending therein, and that a deposited titanium nitride film 32 extends over substrate 14 and within opening 30. Opening 30 can ultimately be utilized for fabrication of a semiconductor device. Opening 30 has a width, and a continuing goal of semiconductor device processing is to decrease a width of semiconductor components to enable higher densities of components to be formed over the same footprint of a semiconductor substrate. Accordingly, a continuing goal of semiconductor device fabrication is to enable uniform deposition of thin films within openings having ever-narrower widths. A problem encountered as the width of opening 30 decreases is that small particle contaminants that are non-problematic relative to large openings, become problematic relative to small openings. An exemplary contaminant is a flake 34 shown in FIG. 2, and shown partially occluding opening 30. Flake 34 can be formed from material which has redeposited on sidewall surface 20 of target 12, and subsequently fallen from target 12 onto a surface of substrate 14. Flake 34 can render it difficult, or even impossible, to form a desired device associated with opening 30. Accordingly, it would be desirable to alleviate or prevent flakes of redeposited material from falling from a target surface onto a semiconductor substrate during sputtering operations.

SUMMARY OF THE INVENTION

In one aspect, the invention encompasses a method of treating a physical vapor deposition target. The target has a sputtering surface and a sidewall edge at a periphery of the sputtering surface. The method comprises pressing a tool against the sidewall edge to form a distribution of imprints in the sidewall edge of the target. The tool is then removed from the sidewall edge, leaving the imprints extending into the sidewall edge.

In another aspect, the invention encompasses a physical vapor deposition target. The target includes a sputtering surface having an outer periphery, and a sidewall edge along the outer periphery of the sputtering surface. The sidewall edge has a repeating pattern of imprints extending therein.

BRIEF DESCRIPTION OF THE DRAWINGS

Preferred embodiments of the invention are described below with reference to the following accompanying drawings.

FIG. 4 is a view of the structure of FIG. 3 shown at a processing step subsequent to that of FIG. 3.

FIG. 5 is a topview of the FIG. 4 structure, with a line 4—4 illustrating the cross-sectional cut corresponding to FIG. 4.

FIG. 6 is a diagrammatic sideview of the structure of FIG. 5, shown at a preliminary processing step for forming imprints in accordance with the method of the present invention.

DETAILED DESCRIPTION OF THE PREFERRED EMBODIMENTS

The invention encompasses methodology which can be utilized to alleviate or prevent the problem described in the "Background" section of this disclosure of flakes falling from a sidewall surface of a physical vapor deposition target onto a surface of a substrate below the target. A first embodiment method of the present invention is described with reference to FIGS. 3–7.

Figure 1:
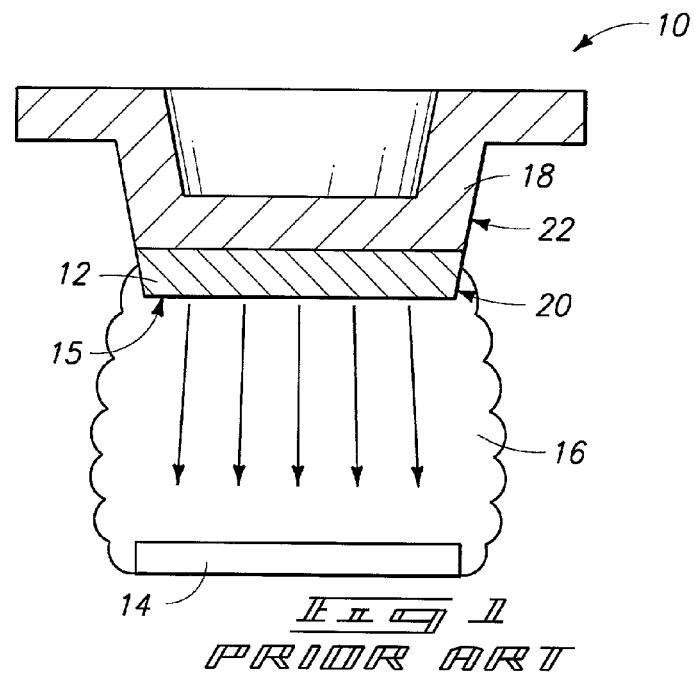
FIG. 1 is a diagrammatic, cross-sectional view of a portion of a prior art physical vapor deposition apparatus.
Figure 2:
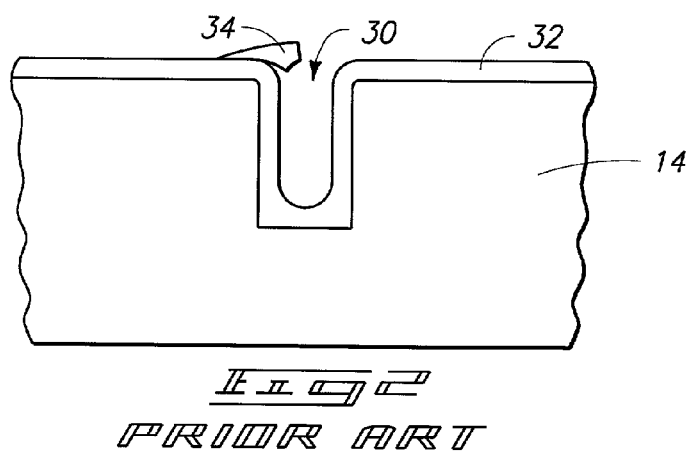
FIG. 2 is a fragmentary, cross-sectional, diagrammatic view of a semiconductor wafer processed according to a prior art sputtering method.
Figure 3:
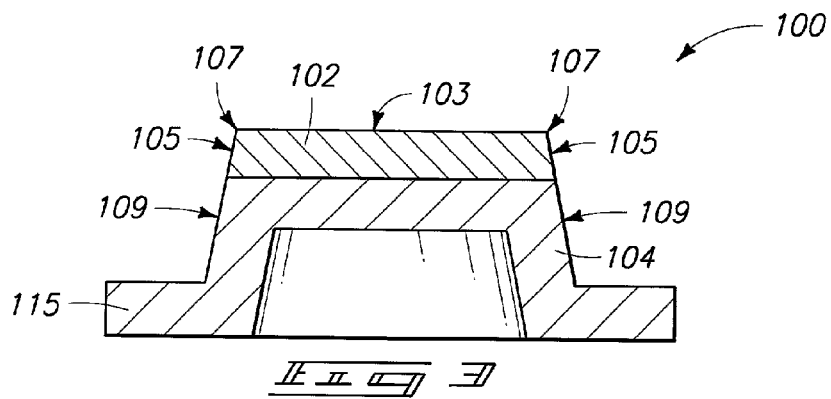
FIG. 3 is a diagrammatic, cross-sectional view of a physical vapor deposition target/backing plate structure.

Referring initially to FIG. 3, a physical vapor deposition target structure 100 is illustrated. Structure 100 comprises a physical vapor deposition target 102 joined to a backing plate 104. Target 102 can comprise either ceramic or metallic materials, and in a particular embodiment can comprise titanium. For instance, target 102 can consist of high-purity titanium, with high purity indicating a purity of at least 99.995%.

Backing plate 104 can comprise an electrically conductive material, such as, for example, copper, and can be joined to target 102 utilizing conventional methods, such as, for example, a solder bond.

Target 102 comprises a sputtering surface 103. Sputtering surface 103 has an outer periphery, and target 102 comprises sidewall edges 105 along the periphery of sputtering surface 103. More specifically, sidewall edges 105 join sputtering surface 103 at corners 107.

Backing plate 104 comprises a sidewall edge 109 which is coextensive with sidewall edge 105, and further comprises a flange 115 at a base of sidewall edge 109. The particular shown shape of backing plate 104 and target 102 corresponds approximately to a particular commercial embodiment of a backing plate\target structure. It is to be understood that the illustrated structure is an exemplary structure, and that processing of the present invention can be utilized with other target\backing plate structures.

Referring to FIG. 4, structure 100 is shown after corners 107 (FIG. 3) are faceted, and accordingly replaced by facets 111. Specifically, the sharp corners 107 of FIG. 3 are filed, ground, or otherwise subjected to processing which removes some of the material 102 to form an angled region 110 (which can alternatively be referred to as a facet region 110) extending between sidewall surfaces 105 and sputtering surface 103. The replacement of sharp corners 107 of the FIG. 3 structure with the facets 111 can be referred to as a beveling operation. For purposes of interpreting this disclosure and the claims that follow, the term "bevel" can refer to any operation in which a corner starting at a first angle is replaced with a facet, and thus replaced by two corners having a larger angle than the first angle. Facets 111 can comprise, for example, a bevel of from about 0.06 inches to about 0.10 inches.

FIG. 5 is a topview of the FIG. 4 structure, and illustrates that the structure 100 can have a circular top surface. Accordingly, an outer periphery of sputtering surface 103 can be circular. The structure shown in FIG. 5 is an exemplary structure, and it is to be understood that the invention can be utilized with target constructions having other shapes, and particularly can be utilized with target structures having non-circular surface shapes.

Referring to FIG. 6, the structure 100 of FIG. 5 is shown in sideview. Also shown is a tool 120 mounted to a spindle 122. Tool 120 comprises a surface 124 having projections 126 formed thereon. Tool 120 and spindle 122 are preferably configured such that surface 124 is pressed against surface 105 of target 102 and rotated so that projections 126 form imprints within surface 105. An axis 130 is illustrated to show rotation of tool 120, and another axis 132 is illustrated to show movement of tool 120 across surface 105. Tool 120 can be referred to as a knurling tool, and the operation accomplished by tool 120 can be referred to as knurling. In practice, spindle 122 can be connected to a motor and support structure (not shown) which rotates spindle 122 and presses spindle 122 and the attached tool 120 toward sidewall 105. It is noted that although the invention is described with reference to rotation and movement of tool 120, it is to be understood that target structure 100 can be moved instead of, or in addition to, tool 120 during formation of imprints within surface 105. For instance, target structure 100 can be placed in a manual lathe and rotated at a speed of from about 20 rpm to about 60 rpm relative to tool 120. Regardless of whether tool 120 is moved, target structure 100 is moved, or tool 120 and target 100 are moved at the same time, target structure 100 is displaced relative to tool 120.

Figure 7:
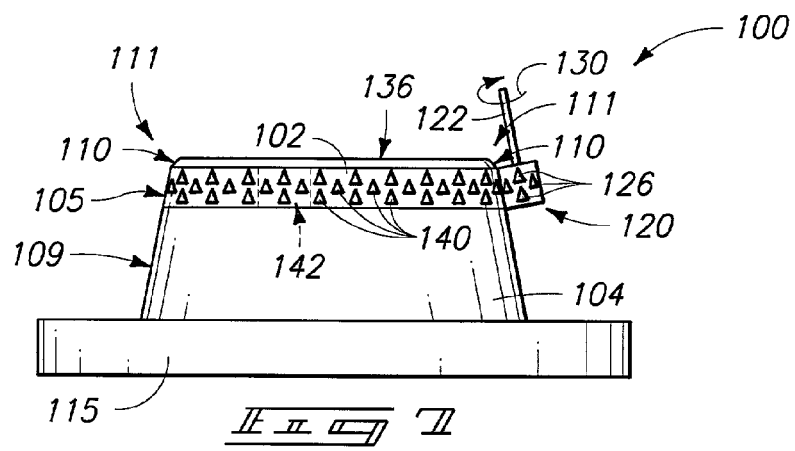
FIG. 7 is a view of the FIG. 6 structure shown at a processing step subsequent to that of FIG. 6.

Referring to FIG. 7, structure 100 is illustrated after tool 120 has been passed across surface 105. The projections 126 have left imprints 140 extending into surface 105 of target 102. Imprints 140 can comprise, for example, a fine, medium or coarse approximately diamond or serrated shape, and can be formed to create knurled surface defined by from about 20 points per inch (ppi) to about 100 ppi, and more typically defined by from about 40 ppi to about 80 ppi. The imprints form a repeating pattern 142 corresponding to the pattern of the imprints on tool 120. The drawing of FIG. 7 has been simplified in showing the pattern 142 corresponding exactly to a complement of the pattern visible on tool 120. In practice, tool 120 would typically have a circular surface 124, and accordingly the pattern visible in FIGS. 5 and 6 is only a portion of the pattern on tool 120. The repeating pattern formed by tool 120 could therefore comprise more than the pattern visible in the sideviews of FIGS. 6 and 7. Regardless, the concept illustrated in FIGS. 6 and 7 is accurate in that tool 120 forms a repeating pattern of imprints 140 extending into surface 105 of target 102. The imprints 140 of FIG. 7 are preferably formed entirely around surface 105, and accordingly would surround sputtering surface 103 for a circular target such as that shown in FIG. 5.

In the shown embodiment, imprints 140 are formed only along sidewall surface 105, and not along surface 109 of backing plate 104, or along facet region 110 of facet 111. The shown embodiment is a preferred embodiment, and it is to be understood that the invention can encompass other embodiments wherein imprints are formed along one or both of surface 109 and surface 110 (see, for example, FIG. 8). However, the formation of imprints into surface 109 can complicate recycling of a backing plate. Specifically, it is common during use of targets for a target to wear out and be removed from a backing plate, and subsequently replaced by another target. If the imprints are formed within backing plate 109, such would typically have to be removed or cleaned of redeposited material formed on surface 109 during a sputtering operation, which would complicate recycling of backing plate 104. Accordingly, it can be desirable to leave surface 109 smooth.

Imprints 140 can alleviate or prevent the problems described in the "Background" section of this disclosure. Specifically, imprints 140 can retain redeposited material formed on sidewall 105 during a sputtering operation, and can accordingly alleviate or prevent flakes of the redeposited material from falling off surface 105 and onto a substrate during a sputtering operation.

Figure 10:
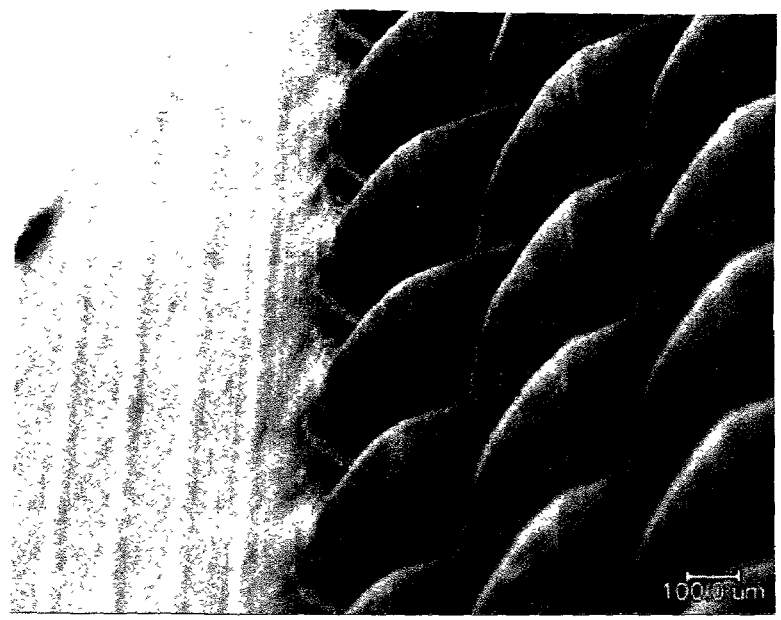
FIG. 10 is a photograph of an imprint pattern which can be utilized in methodology of the present invention.
Figure 11:
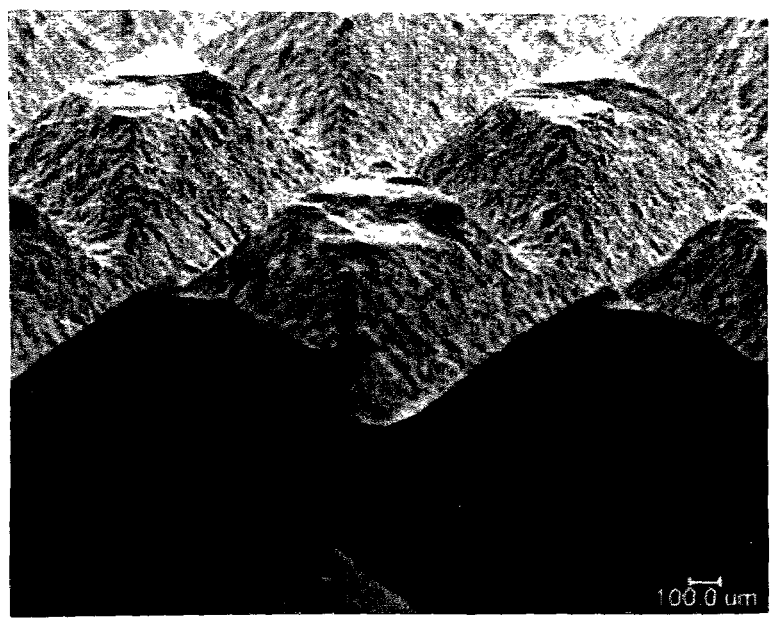
FIG. 11 is a photograph of another imprint pattern which can be utilized in methodology of the present invention.

Any pattern of imprints can be utilized in methodology of the present invention. Two exemplary patterns are shown in FIGS. 10 and 11.

Facets 111 are provided to avoid having sharp edges formed at an outer region of sputtering surface 103. Specifically, if a knurling operation is performed on the structure of FIG. 3 (i.e., a structure which does not have faceted corners formed thereon), sharpened edges can occur at corners 107 where sidewalls 105 join sputtering surface 103. Such sharpened corners can occur as material of physical vapor deposition target 102 is pushed outwardly by projections 126 of tool 120 being pressed into the material of target 102. An edge will thus be formed at corner 107 which can have rolls, crimps, or other non-uniformities extending therefrom. Such non-uniformities can complicate utilization of target 102 in a sputtering process. The formation of facets 111 allows an outer edge of target 103 to remain uniform even after imprints are formed into sidewall surface 105.

Although the invention is shown and described with reference to forming facet 111 prior to forming imprints 140 into surface 105, it is to be understood that facet 111 can also be formed after forming the imprints. Specifically, the problems discussed above relative to formation of a non-uniform edge can be alleviated by removing the edge. Accordingly, the edge can be filed, or otherwise beveled or faceted after formation of imprint regions 140. However, it is found that it can be easier to form a uniform edge surrounding sputtering surface 136 if the faceting occurs prior to imprinting, rather than after imprinting. The non-uniform edge formed by imprinting can complicate a faceting operation, and accordingly it is generally more convenient to perform the faceting prior to forming imprints in sidewall surface 105.

Also, although the invention is shown and described with reference to a structure wherein a target is joined to a backing plate prior to forming imprints in the target, it is to be understood that the imprints can alternatively be formed in the sidewall of the target prior to joining the target to a backing plate. However, difficulties can arise if the imprints are formed prior to joining a target to a backing plate. Specifically, a target is frequently joined to a backing plate using solder, and occasionally some of the solder will be ejected from between the target and backing plate during the joining operation. If the imprints are formed in the target prior to the joining of the target to a backing plate, the ejected solder can deposit in the imprints and be difficult to remove. Also, backing plate 104 can provide a convenient handle for manipulating target 102 during a knurling operation, which can further provide an advantage for mounting target 102 to a backing plate prior to forming imprints within a sidewall surface of the target.

After imprints 140 are formed within sidewall surface 105, tool 120 is removed, and target 105 can be utilized in a sputtering operation.

During the forming of imprints in the operation described with reference to FIGS. 6 and 7, tool 120 can be placed directly against target 105. However, it is found that it can be preferable to provide a lubricating liquid (such as, for example, an oil), between tool 120 and target 105. Such can alleviate scraping of material from tool 120 onto target 105, and can also alleviate scraping of material from target 105 onto tool 120. Preferably, tool 120 is formed of a material which is harder than the material of target 105.

Figure 8:
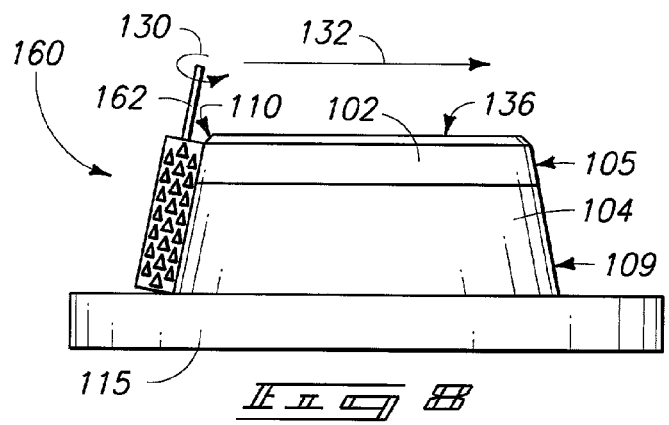
FIG. 8 is a diagrammatic sideview of the structure of FIG. 5 shown at a preliminary step of a second embodiment method of the present invention.

Another embodiment of the invention is described with reference to FIG. 8, which shows a sideview of the structure 100 of FIGS. 4 and 5 treated with a tool 160 configured to extend across both surface 109 of backing plate 104 and surface 105 of target 102. Tool 160 is shown attached to a spindle 162 configured to enable rotation of tool 160 about axis 130 as the tool passes along axis 132 and across surfaces 105 and 109. The embodiment of FIG. 8 will form imprints in backing plate surface 109, as well as forming imprints in target surface 105, and can form the imprints in surface 109 while forming the imprints in surface 105.

Another embodiment of the invention is described with reference to FIG. 9, which shows a sideview of a monolithic target 200. As is known to persons of ordinary skill in the art, a monolithic target is a target which is constructed to be utilized without a backing plate. Accordingly, target 200 comprises a shape of the target/backing plate structure shown in FIGS. 6 and 7. Target 200 comprises a sputtering surface 203, a sidewall surface 205 extending around a periphery of sputtering surface 203, a faceted edge 210 extending between surface 205 and 203, and a flange 215. A tool 220 is shown rotated about an axis 230 and pressed against surface 205. Tool 220 comprises projections 226 which will form imprints within surface 205 analogous to the imprints 140 described with reference to FIGS. 6 and 7. Tool 220 is mounted to a spindle 222 configured to rotate the tool and press the tool against surface 205. Further, tool 220 is configured to be displaced relative to surface 205 along a direction indicated by axis 230 so that imprints are formed entirely around sputtering surface 203. A difference between the configuration of FIG. 9 and that of FIGS. 6 and 7 is that tool 220 is configured to extend entirely along a sidewall 205 between flange 215 and faceted edge 210.

Figure 9:
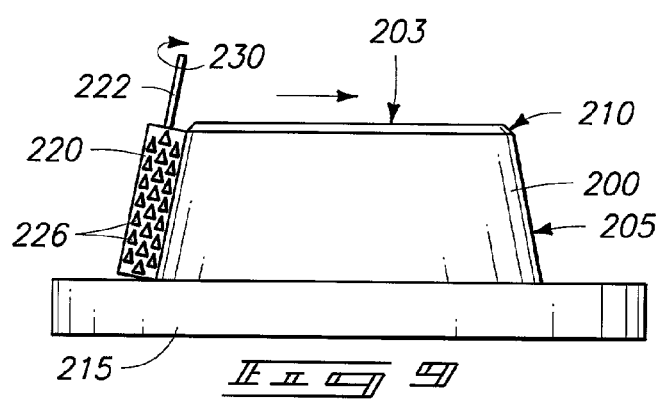
FIG. 9 is a sideview of a monolithic physical vapor deposition target showing a third embodiment method of the present invention.

The target formed in accordance with the methodology of FIG. 9 will have an entirety of a sidewall surface having imprints therein, and accordingly can alleviate or prevent dropping of flakes from the sidewall surface during a sputter deposition process.

It is noted that the methodology described herein is exemplary methodology for forming physical vapor deposition targets encompassed by the present invention, and that other methods can be utilized. For instance, targets can be molded into shapes having the imprint patterns provided therein, and accordingly the patterns can be formed without utilization of a knurling tool.

What is claimed is:

1. A method of treating a physical vapor deposition target having a sputtering surface and a sidewall edge proximate a periphery of the sputtering surface, comprising:
   pressing a tool against the sidewall edge to form a distribution of imprints in the sidewall edge of the target; and
   removing the tool from the sidewall edge.

2. The method of claim 1 wherein the distribution of imprints forms a repeating pattern on the sidewall edge.

3. The method of claim 1 wherein the imprints are in the form of approximately diamond shapes.

4. The method of claim 1 wherein the physical vapor deposition target comprises a metallic material.

5. The method of claim 1 wherein the physical vapor deposition target comprises titanium.

6. The method of claim 1 wherein the physical vapor deposition target comprises a ceramic material.

7. The method of claim 1 wherein the sidewall edge joins the sputtering surface at a corner, and further comprising facetting the corner before the pressing.

8. The method of claim 1 wherein the sidewall edge joins the sputtering surface at a corner, and further comprising facetting the corner after the pressing.

9. The method of claim 1 wherein the physical vapor deposition target periphery is circular, wherein the sidewall edge surrounds the circular periphery and further comprising displacing the tool relative to the target to move the tool around the circular target periphery during the pressing.

10. The method of claim 9 further comprising providing a liquid lubricant between the tool and the target periphery during the pressing.

11. The method of claim 1 further comprising joining the target to a backing plate, and wherein the joining occurs before pressing the tool against the sidewall edge.

12. The method of claim 11 wherein the backing plate has a sidewall edge coextensive with the sidewall edge of the physical vapor deposition target, and wherein the tool is not pressed against said sidewall edge of the backing plate.

13. The method of claim 11 wherein the backing plate has a sidewall edge coextensive with the sidewall edge of the physical vapor deposition target, and wherein the tool is pressed against said sidewall edge of the backing plate to form imprints in the sidewall edge of the backing plate while forming the imprints in the sidewall edge of the target.

* * * * *